United States Patent
Kamimura et al.

(10) Patent No.: US 10,696,048 B2
(45) Date of Patent: Jun. 30, 2020

(54) METHOD OF MANUFACTURING INKJET HEAD SUBSTRATE

(71) Applicant: CANON KABUSHIKI KAISHA, Tokyo (JP)

(72) Inventors: Takayuki Kamimura, Kawasaki (JP); Masataka Kato, Hiratsuka (JP); Hiroshi Higuchi, Atsugi (JP); Atsunori Terasaki, Kawasaki (JP); Shuichi Tamatsukuri, Asaka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/184,858

(22) Filed: Nov. 8, 2018

(65) Prior Publication Data

US 2019/0160820 A1 May 30, 2019

(30) Foreign Application Priority Data

Nov. 29, 2017 (JP) ................... 2017-229294

(51) Int. Cl.
  *B41J 2/16* (2006.01)
  *G03F 7/36* (2006.01)
  *B41J 2/14* (2006.01)

(52) U.S. Cl.
  CPC .......... *B41J 2/1628* (2013.01); *B41J 2/1404* (2013.01); *B41J 2/14145* (2013.01); *B41J 2/1601* (2013.01); *B41J 2/1603* (2013.01); *B41J 2/164* (2013.01); *B41J 2/1607* (2013.01); *B41J 2/1623* (2013.01); *B41J 2/1629* (2013.01); *B41J 2/1631* (2013.01); *B41J 2/1632* (2013.01); *B41J 2/1634* (2013.01); *G03F 7/36* (2013.01)

(58) Field of Classification Search
  None
  See application file for complete search history.

(56) References Cited

U.S. PATENT DOCUMENTS

| 5,433,000 A * | 7/1995 | Tamura | H05K 1/115 174/261 |
| 6,563,079 B1 * | 5/2003 | Umetsu | B23K 26/18 219/121.69 |
| 8,413,324 B2 * | 4/2013 | Noda | H05K 3/0032 29/825 |
| 9,548,207 B2 * | 1/2017 | Ogata | H01L 21/3065 |

(Continued)

FOREIGN PATENT DOCUMENTS

JP  2005125516 A  5/2005

*Primary Examiner* — Allan W. Olsen
(74) *Attorney, Agent, or Firm* — Canon U.S.A., Inc. IP Division (57) ABSTRACT

A method of manufacturing an inkjet head substrate is provided. The inkjet head substrate includes an ink supply port having a through portion and a non-through portion, and the non-through portion is disposed at a position closer than the through portion to the energy generating element. The method includes disposing a mask having an opening that has a relatively large opening-width portion and a relatively small opening-width portion. The method also includes forming the through portion in the substrate at a position corresponding to the relatively large opening-width portion and the non-through portion in the substrate at a position corresponding to the relatively small opening-width portion by performing reactive ion etching on the substrate through the opening of the mask in one operation.

10 Claims, 12 Drawing Sheets

(56) References Cited

U.S. PATENT DOCUMENTS

| | | | |
|---|---|---|---|
| 2011/0115955 A1* | 5/2011 | Okutani | H01L 27/14618 |
| | | | 348/300 |
| 2012/0080772 A1* | 4/2012 | Asami | H01L 21/76898 |
| | | | 257/532 |
| 2013/0161073 A1* | 6/2013 | Lee | H05K 3/4644 |
| | | | 174/251 |
| 2014/0004629 A1* | 1/2014 | Fujita | H01L 21/6708 |
| | | | 438/21 |
| 2019/0001675 A1* | 1/2019 | Kato | B41J 2/14129 |

* cited by examiner

METHOD OF MANUFACTURING INKJET HEAD SUBSTRATE

BACKGROUND OF THE DISCLOSURE

Field of the Disclosure

The disclosure relates to a method of manufacturing a substrate that is used in an inkjet head.

Description of the Related Art

An inkjet printer that discharges ink and thereby performs printing or the like includes an inkjet head serving as a portion for discharging ink. As described in Japanese Patent Laid-Open No. 2005-125516, the inkjet head has an energy generating element that generates energy for discharging ink and also has an inkjet head substrate through which an ink supply port for supplying ink passes.

The inkjet head, which discharges ink by using energy generated by the energy generating element, can perform high-speed recording by increasing ink discharge frequency. In this type of inkjet head substrate, reducing the distance between the energy generating element and the ink supply port can improve the speed of supplying ink to the energy generating element, which can thereby increase the ink discharge frequency.

However, if the ink supply port, which is a through-hole, is simply relocated toward the energy generating element, the width of the substrate located under the energy generating element becomes small. This leads to a problem that the strength of the substrate may decrease or adhesion performance may deteriorate due to an insufficient adhesion area for adhering to another member on the back surface of the substrate. In order to avoid this occurring, the substrate may be excavated near the energy generating element, and the excavated portion may serve as part of the ink supply port. In other words, the ink supply port may be provided with a through portion that passes through the substrate and a non-through portion that does not pass through the substrate, and the non-through portion may be disposed at a position closer than the through portion to the energy generating element in a region near the front surface of the substrate.

In the case of forming the through portion and the non-through portion in the ink supply port of the inkjet head substrate, it is normal to form these portions by separate operations because these portions are different in depth. However, forming the through portion and the non-through portion by separate operations increases the number of processing steps and thereby decreases productivity.

SUMMARY OF THE DISCLOSURE

An aspect of the disclosure provides a method of manufacturing an inkjet head substrate that includes an ink supply port having a through portion that passes through the inkjet head substrate from a first surface thereof on which the energy generating element is disposed to a second surface thereof that is opposite to the first surface and a non-through portion that does not pass through from the first surface to the second surface, the non-through portion being disposed at a position closer than the through portion to the energy generating element in a region near the first surface. The method includes providing a substrate, disposing a mask on the first surface of the substrate, the mask including an opening that has a relatively large opening-width portion and a relatively small opening-width portion, in which the opening width is measured in a predetermined direction, and forming the through portion in the substrate at a position corresponding to the relatively large opening-width portion and the non-through portion in the substrate at a position corresponding to the relatively small opening-width portion by performing reactive ion etching on the substrate through the opening of the mask in a single operation.

Further features and aspects of the disclosure will become apparent from the following description of example embodiments with reference to the attached drawings.

DESCRIPTION OF THE EMBODIMENTS

The disclosure provides an example method of manufacturing an inkjet head substrate by which an inkjet head substrate can be manufactured efficiently even in a case in which a through portion and a non-through portion are formed within an ink supply port of an inkjet head substrate.

An example liquid discharge head substrate according to embodiments of the disclosure will be described with reference to the drawings.

Figure 1A:
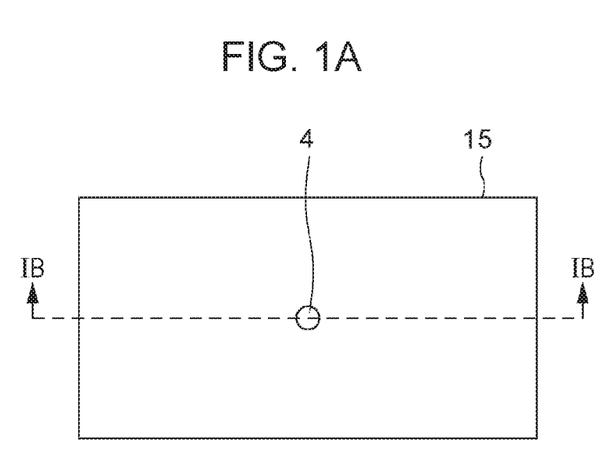
FIGS. 1A and 1B are views illustrating an example inkjet head substrate.
Figure 1B:
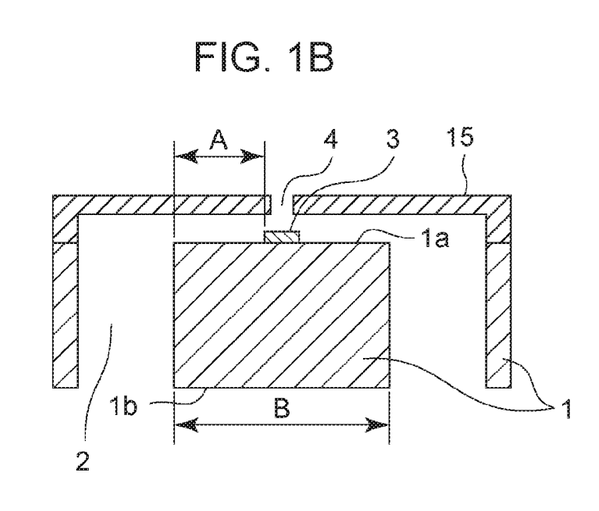

FIGS. 1A and 1B illustrate part of an inkjet head substrate. FIG. 1A illustrates the inkjet head substrate, which is viewed from an upper region (a region facing a discharge opening 4). FIG. 1B is a cross section of the inkjet head substrate, which is cut along line IB-IB in FIG. 1A. The inkjet head substrate has a substrate 1 that is made of a material, such as silicon. The substrate 1 has a first surface 1a on which an energy generating element 3 is formed. A piezoelectric element or an electrothermal conversion element can be used for the energy generating element 3. The substrate 1 has a second surface 1b that is opposite to the first surface 1a. The substrate 1 is provided with an ink supply port 2 that passes through the substrate 1 from the first surface 1a to the second surface 1b. The ink supply port 2 is a through-hole through which ink is supplied from the second surface side of the substrate 1 to the first surface side. The ink supplied to the first surface side flows through a flow path formed by a flow path member 15, and energy that is generated by the energy generating element 3 is imparted to the ink. The energy causes ink to be discharged from the discharge opening 4 that is formed in the flow path member 15 onto a recording medium, such as a sheet of paper.

As described above, in the case of increasing ink discharge frequency in an inkjet head substrate, reducing the distance between the energy generating element 3 and the ink supply port 2 (i.e., the length indicated by reference A in FIG. 1B) leads to favorable performance.

Figure 2A:
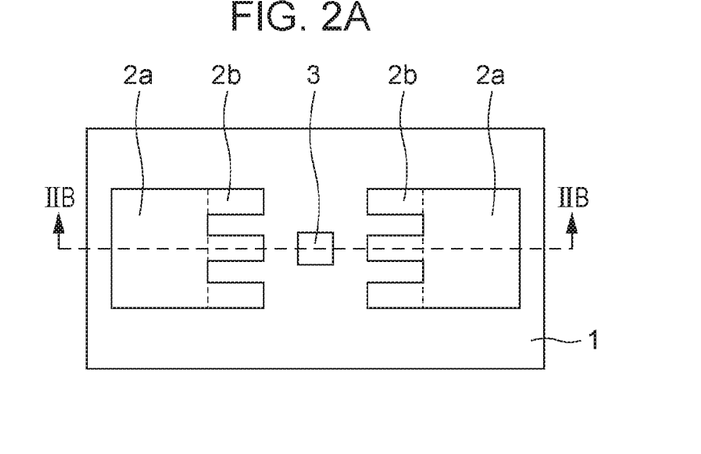
FIGS. 2A to 2E are views illustrating example inkjet head substrates.
Figure 2B:
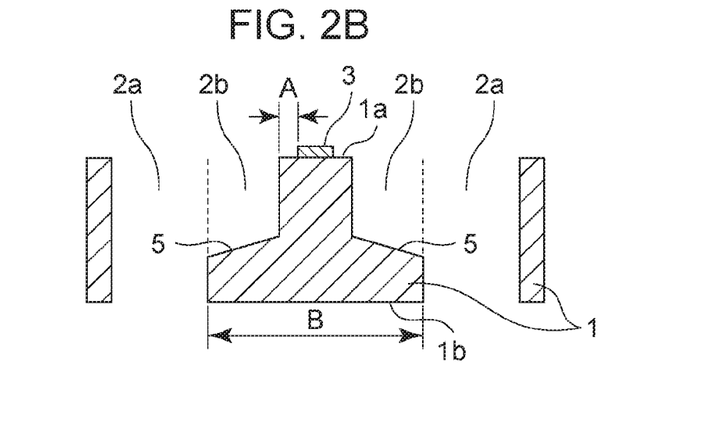

FIGS. 2A to 2E are views illustrating inkjet head substrates, in which the flow path member and the discharge opening are omitted. FIG. 2A illustrates the inkjet head substrate that is viewed from above. FIG. 2B is a cross section of the inkjet head substrate, which is cut along line IIB-IIB in FIG. 2A. In FIGS. 2A to 2E, the ink supply port includes a through portion 2a and a non-through portion 2b. The through portion 2a is a portion of the ink supply port that passes through the substrate 1 from the first surface 1a to the second surface 1b. The non-through portion 2b is a portion of the ink supply port that does not pass through the substrate 1 from the first surface 1a to the second surface 1b. An inclined surface 5 of the substrate 1 is disposed under the non-through portion 2b. As illustrated in FIGS. 2A to 2E, the non-through portion 2b is provided in a region near the first surface 1a of the substrate 1 at a position closer than the through portion 2a to the energy generating element 3. In the substrate 1 in FIG. 2B, the distance between the energy generating element and the ink supply port (i.e., the length indicated by reference A) is smaller than the distance in the substrate 1 in FIG. 1B to the extent that the non-through portion 2b occupies. In other words, the ink supply port is formed closer to the energy generating element. In addition, the ink supply port is formed closer to the energy generating element not by simply relocating the ink supply port but by providing the non-through portion 2b. This is beneficial in that the length of the second surface 1b of the substrate 1 (the portion indicated by reference B) can be made larger. The portion indicated by reference B serves as an adhesion portion when the substrate 1 is adhered, for example, to a support member. A small adhesion portion may lead to insufficient adhesion, which results in the likelihood of different color inks being mixed to each other in a substrate that can discharge a plurality of color inks. The ink supply port can be formed in the substrate 1 by using a known method, such as drilling, laser beam piercing, sandblasting, crystal anisotropic etching, or reactive ion etching. Especially by using the reactive ion etching, an almost vertical ink supply port can be formed, which can readily form the ink supply port at a position close to the energy generating element. However, if the ink supply port is vertical, the length of the adhesion portion tends to be small. However, providing the non-through portion 2b can extend the length of the second surface 1b of the substrate 1 (the portion indicated by reference B), which serves as the adhesion portion. If the non-through portion 2b is not provided and the ink supply port 2 is simply relocated toward the energy generating element 3, the length indicated by reference B becomes small, which leads to the above problem in adhesion. In addition, if the length of the portion indicated by reference B is small, the strength of the substrate 1 itself decreases, which may lead to deformation or breakage of the substrate 1.

Figure 2C:
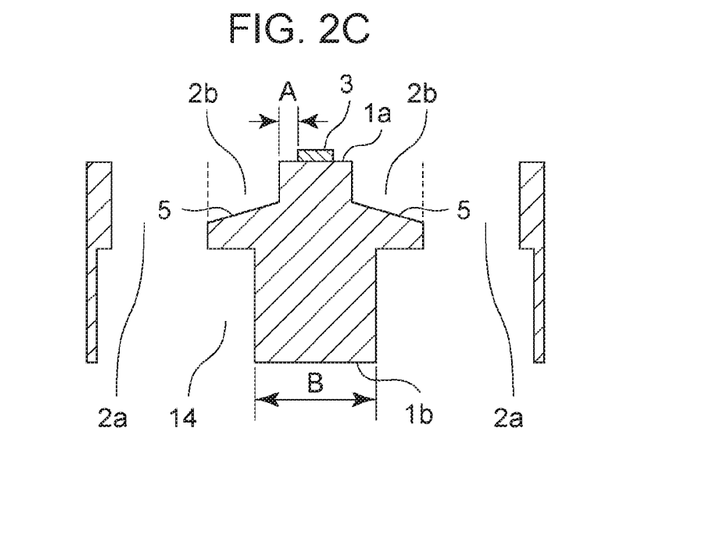

The shape of the inkjet head substrate is not limited to that illustrated in FIG. 2B. For example, as illustrated in FIG. 2C, a second ink supply port 14 may be provided under the ink supply port having the through portion 2a and the non-through portion 2b (i.e., a first ink supply port). The width of the second ink supply port 14 is different from that of the first ink supply port. The second ink supply port 14 may be provided in a substrate different from the substrate in which the first ink supply port is formed.

Figure 2D:
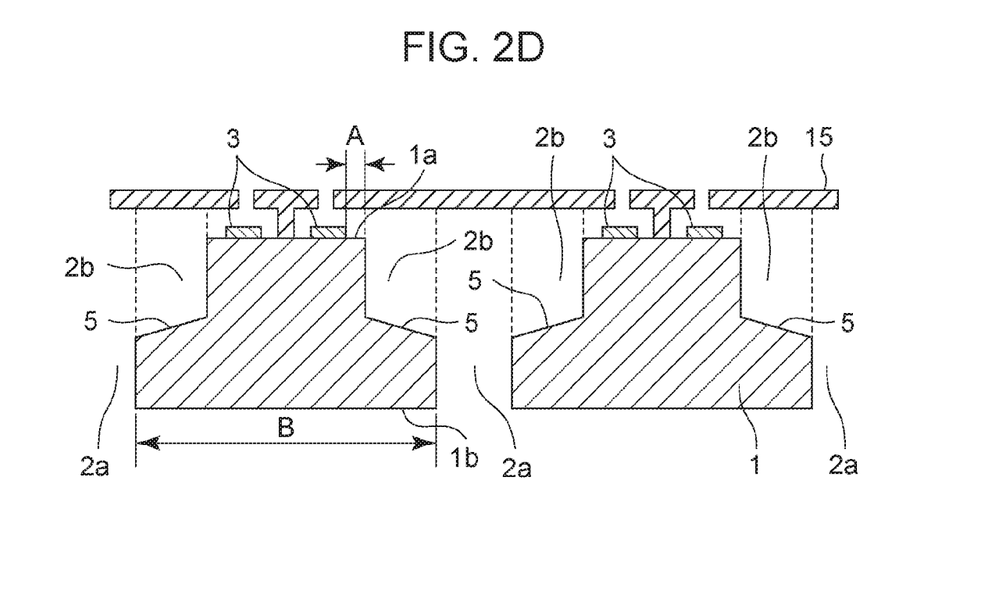

FIG. 2D illustrates the inkjet head substrate and a flow path member 15. In the substrates 1 in FIGS. 2B and 2C, the non-through portions 2b (as well as the through portions 2a) are provided on both sides of the energy generating element 3. In contrast, as illustrated in FIG. 2D, the non-through portion 2b (and the through portion 2a) may be provided only on one side of the energy generating element 3 and the flow path member 15 is provided on the other side.

Figure 2E:
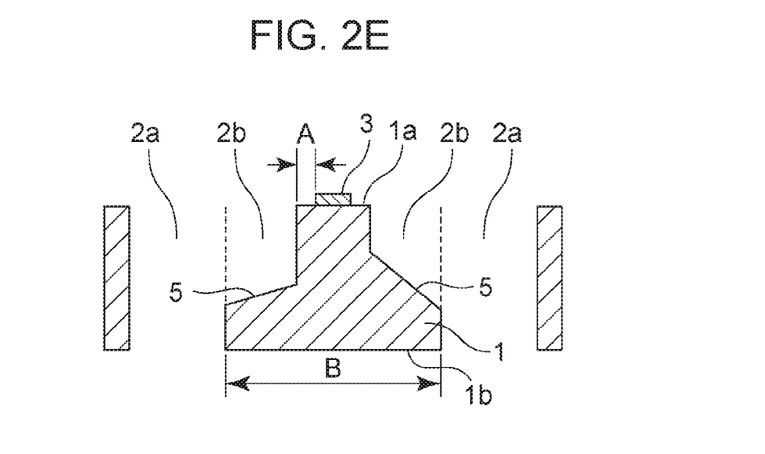

In FIGS. 2B and 2C, the non-through portions 2b and the inclined surfaces 5 on both sides of the energy generating element 3 are shaped symmetrically. In contrast, as illustrated in FIG. 2E, the non-through portions 2b and the inclined surfaces 5 on both sides of the energy generating element 3 may be shaped asymmetrically. For example, as illustrated in FIG. 2E, the inclined surfaces 5 on both sides of the energy generating element 3 may have different angles of inclination. Alternatively, for example, the non-through portions 2b on both sides of the energy generating element 3 may have different widths.

Next, an example method of manufacturing the inkjet head substrate that includes the ink supply port having the through portion and the non-through portion will be described.

Figure 3A:
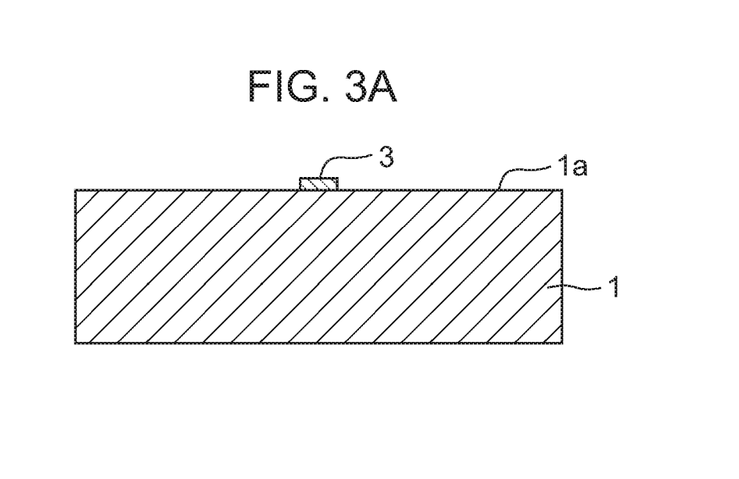
FIG. 3A to 3F are views illustrating an example method of manufacturing an inkjet head substrate.

A substrate 1 as illustrated in FIG. 3A is provided first. The substrate 1 has the energy generating element 3 on the first surface 1a.

Figure 3B:
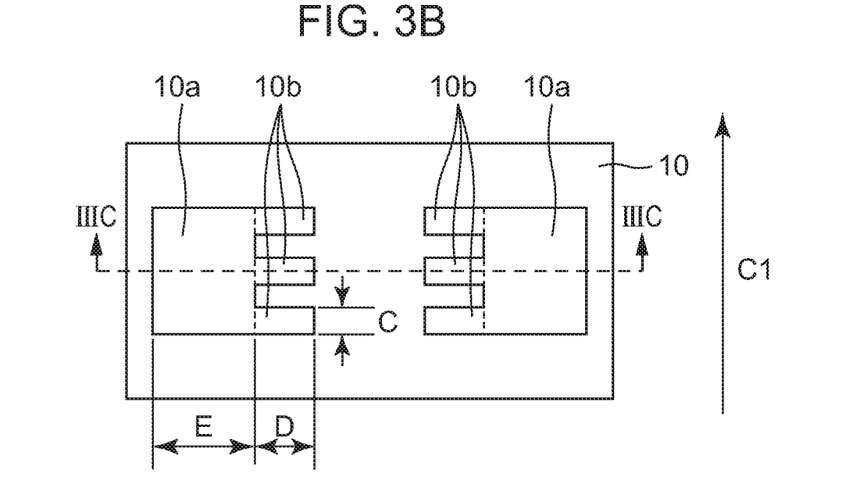
Figure 3C:
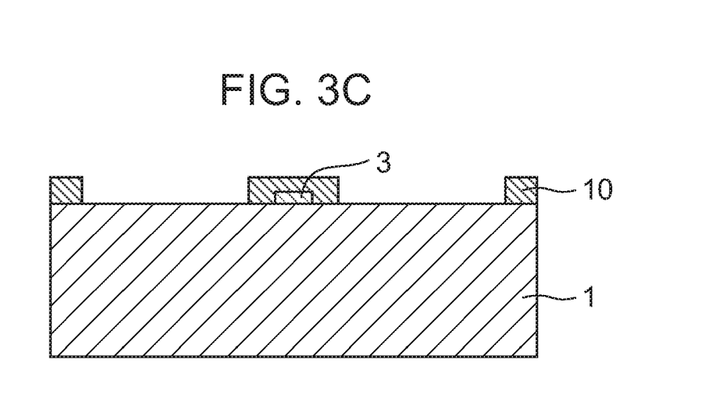

Next, a mask having openings is disposed on the first surface 1a of the substrate 1. FIG. 3B illustrates a mask to be disposed on the substrate when the mask is viewed from above. FIG. 3C is a cross section of the substrate with the mask on top, which is cut along IIIC-IIIC in FIG. 3B. A mask 10 is provided with openings each of which includes a relatively large opening-width portion 10a and a relatively small opening-width portion 10b, in which the opening width is measured in the predetermined direction (direction C1). The mask 10 is preferably formed of a material that is resistant to reactive ion etching that is subsequently performed onto the substrate 1. For example, the mask 10 may be formed of a resin such as a polyetheramide resin or a metal such as aluminum. As illustrated in FIG. 3C, the mask 10 is disposed so as to cover the energy generating element 3. Note that in FIGS. 3A to 3F, the predetermined direction (direction C1) is parallel to an arranging direction of energy generating elements 3. In FIGS. 3A to 3F, only one energy generating element is illustrated and other energy generating elements are omitted. However, multiple energy generating elements are arranged in the depth direction in the image of FIG. 3A or in the top-bottom direction in the image of FIG. 3B. These directions correspond to the arranging direction of the energy generating elements.

After the mask 10 is disposed, reactive ion etching is performed on the substrate 1 through the openings of the mask 10. During reactive ion etching, the etching rate increases due to the microloading effect on a portion of the substrate 1 that corresponds to the relatively large opening-width portion compared with a portion of the substrate 1 that corresponds to the relatively small opening-width portion, in which the opening width is measured in the predetermined direction. In other words, etching progresses faster on the portion of the substrate 1 that corresponds to the relatively large opening-width portion 10a. Reactive ion etching is stopped after etching penetrates through the portion of the substrate 1 that corresponds to the relatively large opening-width portion 10a. At this time, in the relatively small opening-width portion 10b, etching does not penetrate through the substrate 1. After the etching is done, the mask 10 is not needed and is removed.

Figure 3D:
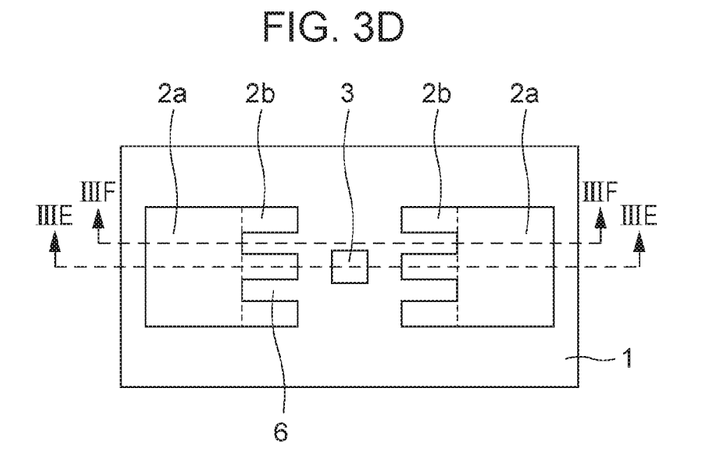
Figure 3E:
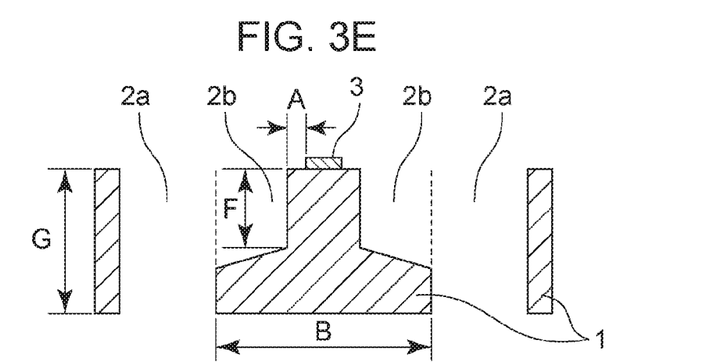
Figure 3F:
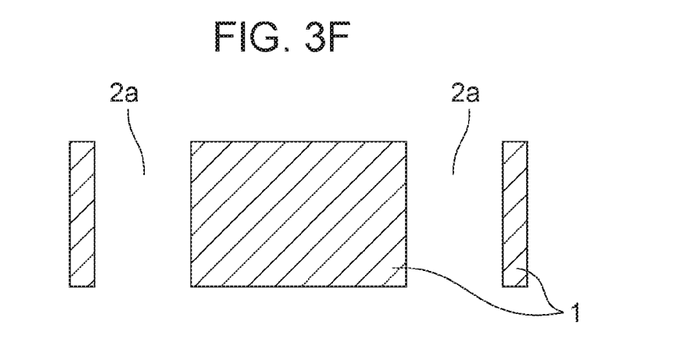

FIGS. 3D to 3F illustrate the substrate 1 after the mask 10 is removed. FIG. 3D illustrates the substrate 1, which is viewed from above. FIG. 3E is a cross section of the substrate 1, which is cut along line IIIE-IIIE in FIG. 3D. FIG. 3F is a cross section of the substrate 1, which is cut along line IIIF-IIIF in FIG. 3D. Thus, the through portion 2*a* is formed in the portion of the substrate 1 that corresponds to the relatively large opening-width portion, and the non-through portion 2*b* is formed in the portion of the substrate 1 that corresponds to the relatively small opening-width portion, in which the opening width is measured in the predetermined direction. The through portion 2*a* and the non-through portion 2*b* are formed by taking advantage of the microloading effect produced due to the difference in the opening width of the mask. Accordingly, the through portion 2*a* and the non-through portion 2*b* can be formed by a single etching operation.

Figure 4A:
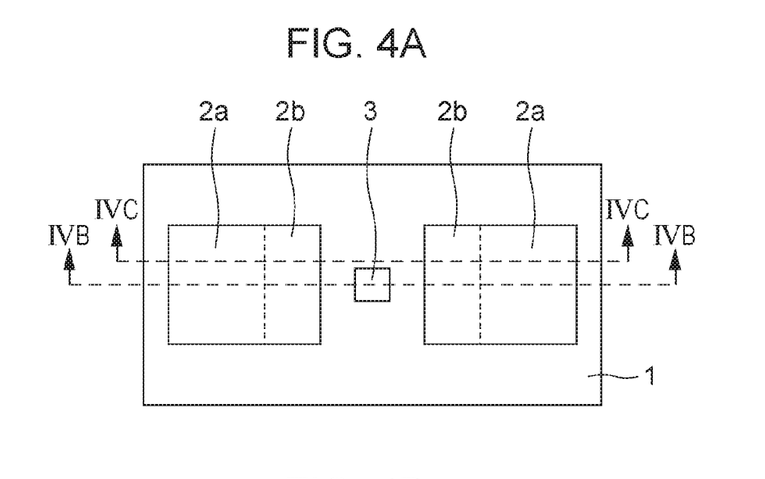
FIGS. 4A to 4C are views illustrating an example inkjet head substrate.
Figure 4B:
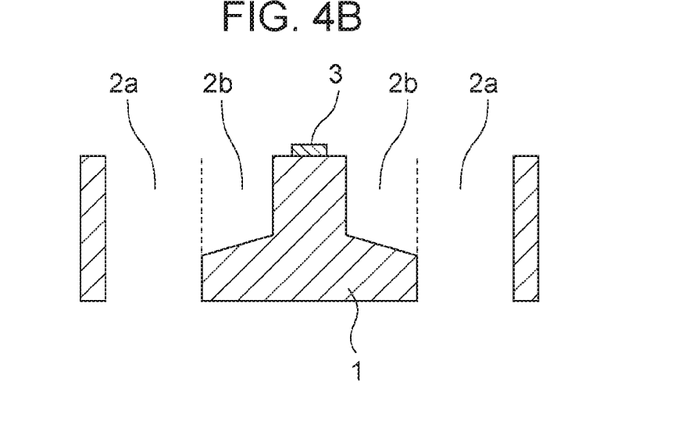
Figure 4C:
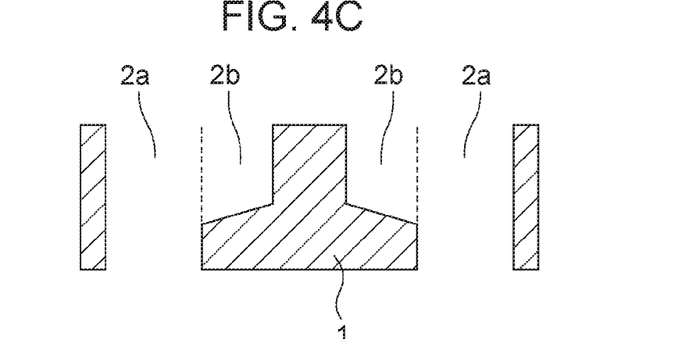

Here, etching may leave a portion of the substrate 1 unetched (an unetched portion 6) between adjacent non-through portions 2*b* as illustrated in FIG. 3D due to geometric constraints in forming openings in the mask. The unetched portions 6 may be removed by wet etching, dry etching, or the like. FIGS. 4A to 4C illustrate the substrate 1 after unetched portions 6 are removed. When the unetched portions 6 are removed by etching, etching progresses in the unetched portions 6 from the first surface of the substrate 1 as well as from the non-through portions 2*b*. The unetched portions 6 are thereby removed more readily than other portions of the substrate 1. FIG. 4A illustrates the substrate 1 after the unetched portions 6 are removed from the substrate 1 in FIG. 3D. FIG. 4B is a cross section of the substrate 1 that is cut along line IVB-IVB in FIG. 4A, and this cross section corresponds to that in FIG. 3E. FIG. 4C is a cross section of the substrate 1 that is cut along line IVC-IVC in FIG. 4A, and this cross section corresponds to that in FIG. 3F. Note that the non-through portion 2*b* does not pass through the substrate 1 even after the unetched portions are removed.

Figure 5A:
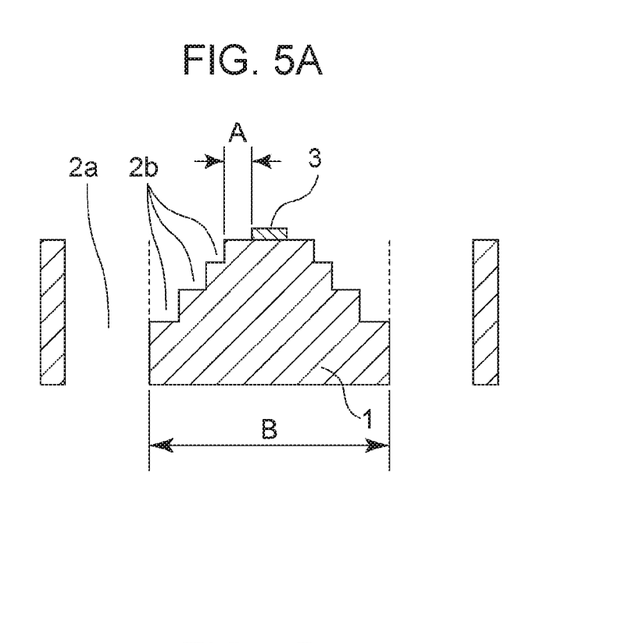
FIGS. 5A to 5D are views illustrating example inkjet head substrates.

The liquid discharge head substrate described in FIGS. 2A to 2E has the inclined surfaces 5 under the non-through portion 2*b*. The liquid discharge head substrate according to the disclosure is not limited to this configuration. As illustrated in FIG. 5A, the lower part of the non-through portion 2*b* of the ink supply port may be shaped like steps. Here, the lower part is part located in the opposite direction of discharging ink. The substrate is located lower than the energy generating element.

Figure 5B:
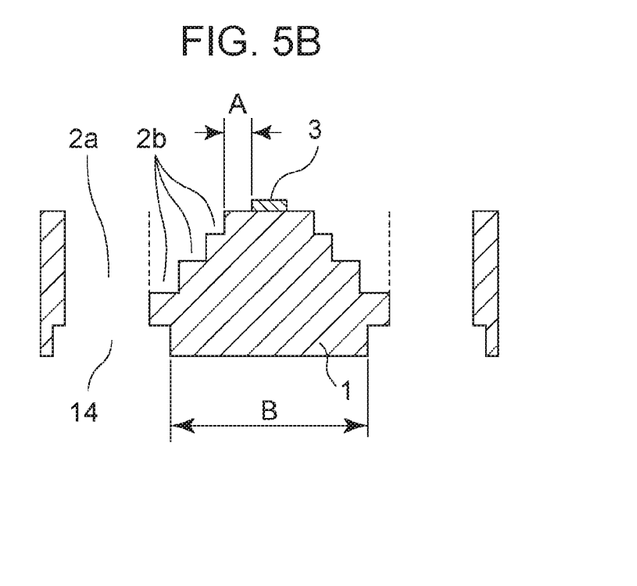

As illustrated in FIG. 5B, the liquid discharge head substrate in FIG. 5A may have a second ink supply port 14 provided under the ink supply port having the through portion 2*a* and the non-through portion 2*b* (i.e., first ink supply port). The width of the second ink supply port 14 is different from that of the first ink supply port. The second ink supply port 14 may be provided in a substrate that is different from the substrate in which the first ink supply port is formed.

Figure 5C:
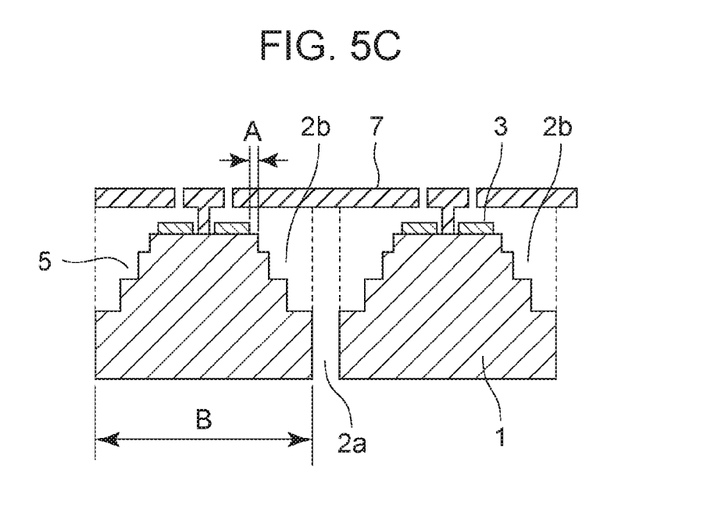
Figure 5D:
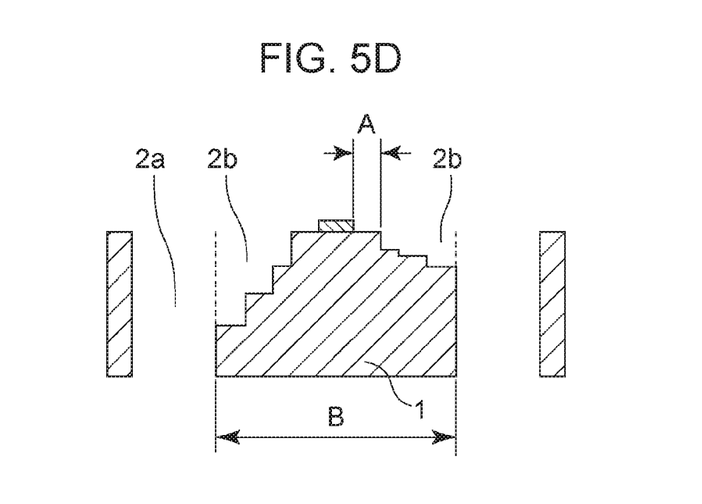

Moreover, as illustrated in FIG. 5C, the non-through portion 2*b* may be provided only on one side of the energy generating element 3. In addition, as illustrated in FIG. 5D, the non-through portions 2*b* and the steps on both sides of the energy generating element 3 may be shaped asymmetrically (for example, having different inclinations or lengths).

The method of manufacturing the inkjet head substrate is not limited to the method described with reference to FIGS. 3A to 3F. Next, another example method of manufacturing the inkjet head substrate will be described with reference to FIGS. 6A to 6E.

Figure 6A:
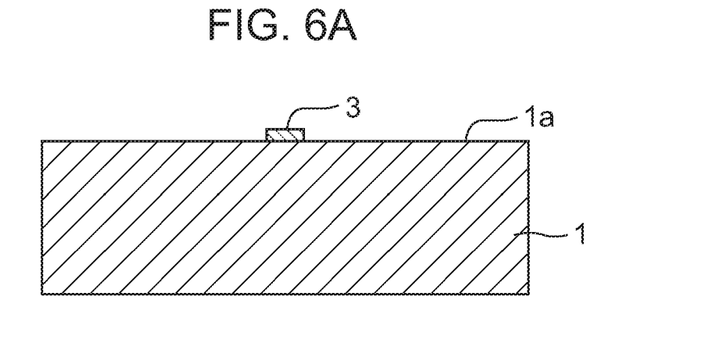
FIGS. 6A to 6E are views illustrating an example method of manufacturing an inkjet head substrate.

A substrate 1 as illustrated in FIG. 6A is provided first. The substrate 1 has the energy generating element 3 on the first surface 1*a*. The arranging direction of the energy generating elements is the same as that described with reference to FIGS. 3A to 3F.

Figure 6B:
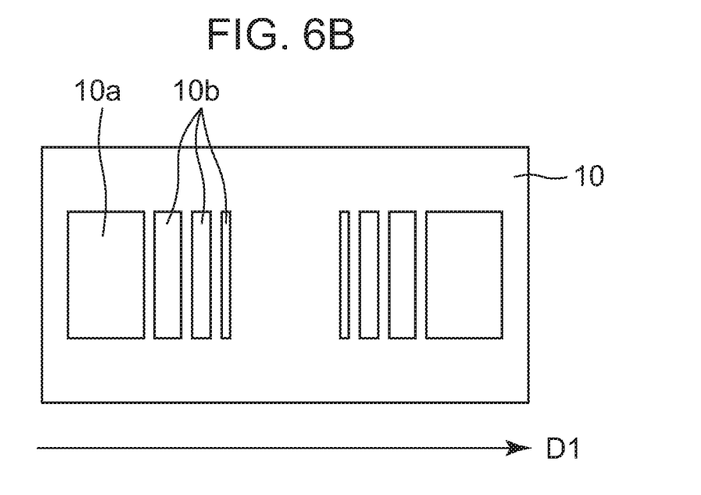
Figure 6C:
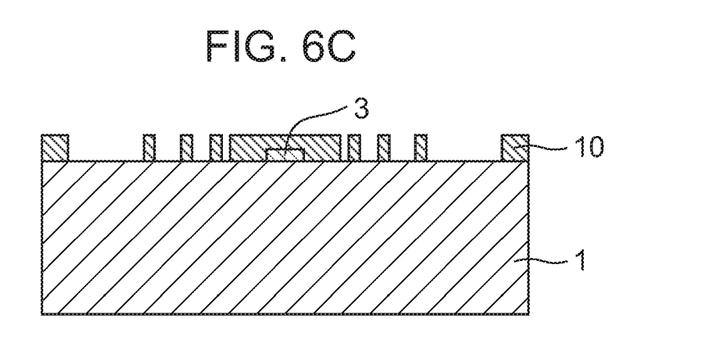

Next, a mask having openings is disposed on the first surface 1*a* of the substrate 1. FIG. 6B illustrates the mask to be disposed on the substrate, in which the mask is viewed from above. FIG. 6C is a cross section of the substrate with the mask on top. In FIGS. 3A to 3F, the predetermined direction (direction C1) is parallel to the arranging direction of energy generating elements 3. On the other hand, in FIG. 6B, the predetermined direction (direction D1) intersects the arranging direction of energy generating elements 3. In addition, in FIGS. 3A to 3F, a single opening includes the relatively large opening-width portion and the relatively small opening-width portions. On the other hand, in FIGS. 6A to 6E, the relatively large opening-width portions and the relatively small opening-width portions are allocated to multiple openings. In FIGS. 6A to 6E, the opening width that is measured in a direction intersecting the predetermined direction is constant in each opening. However, the opening width in each opening need not be constant. The mask 10 is preferably formed of a material that is resistant to reactive ion etching that is subsequently performed onto the substrate 1. For example, the mask 10 may be formed of a resin such as a polyetheramide resin or a metal such as aluminum. As illustrated in FIG. 6C, the mask 10 is disposed so as to cover the energy generating element 3.

After the mask 10 is disposed, reactive ion etching is performed on the substrate 1 through the openings of the mask 10. During reactive ion etching, the etching rate increases due to the microloading effect on a portion of the substrate 1 that corresponds to the relatively large opening-width portion compared with a portion of the substrate 1 that corresponds to the relatively small opening-width portion, in which the opening width is measured in the predetermined direction. In other words, etching progresses faster on the portion of the substrate 1 that corresponds to the relatively large opening-width portion 10*a*. Reactive ion etching is stopped after etching penetrates through the portion of the substrate 1 that corresponds to the relatively large opening-width portion 10*a*. At this time, in the relatively small opening-width portion 10*b*, etching does not penetrate through the substrate 1. After the etching is done, the mask 10 is not needed and is removed.

Figure 6D:
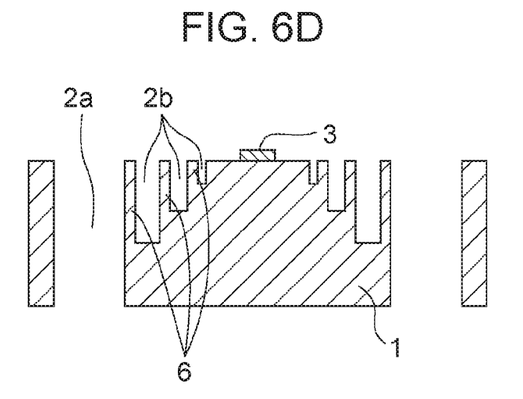

FIG. 6D illustrates a cross section of the substrate 1 after the mask 10 is removed. Thus, the through portion 2*a* is formed in the portion of the substrate 1 that corresponds to the relatively large opening-width portion, and the non-through portion 2*b* is formed in the portion of the substrate 1 that corresponds to the relatively small opening-width portion, in which the opening width is measured in the predetermined direction. The through portion 2*a* and the non-through portion 2*b* are formed by taking advantage of the microloading effect produced due to the difference in the opening width of the mask. Accordingly, the through portion 2*a* and the non-through portion 2*b* can be formed by a single etching operation.

Figure 6E:
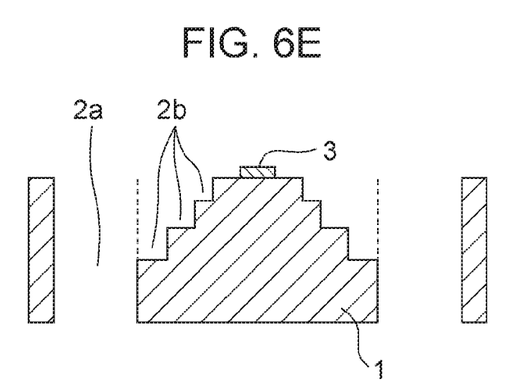

In the method of manufacturing the inkjet head substrate described with reference to FIGS. 6A to 6E, etching may also leave a portion of the substrate 1 unetched (an unetched portion 6) between adjacent non-through portions 2*b* as illustrated in FIG. 6D. The unetched portions 6 may be removed by wet etching, dry etching, or the like. FIG. 6E illustrates the substrate 1 after unetched portions 6 are removed. Note that the non-through portion 2*b* does not pass through the substrate 1 even after the unetched portions are removed.

Figure 7A:
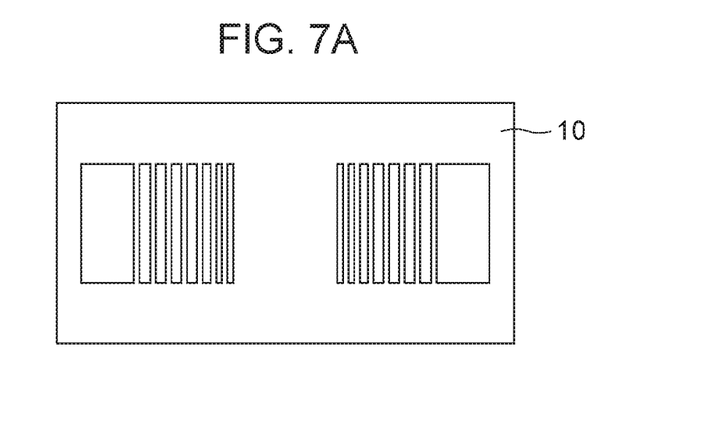
FIGS. 7A to 7C are views illustrating an example method of manufacturing an inkjet head substrate.
Figure 7B:
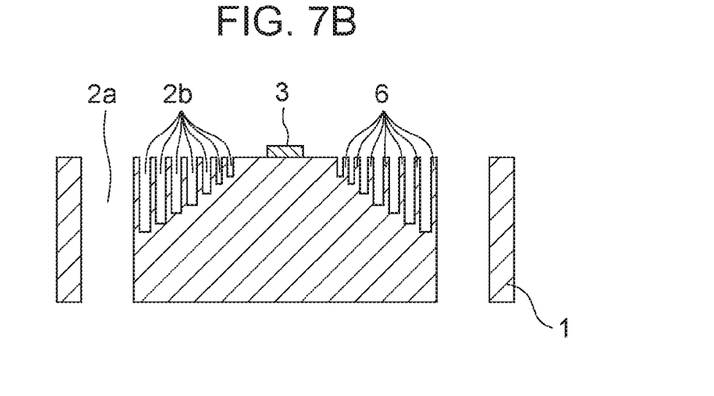
Figure 7C:
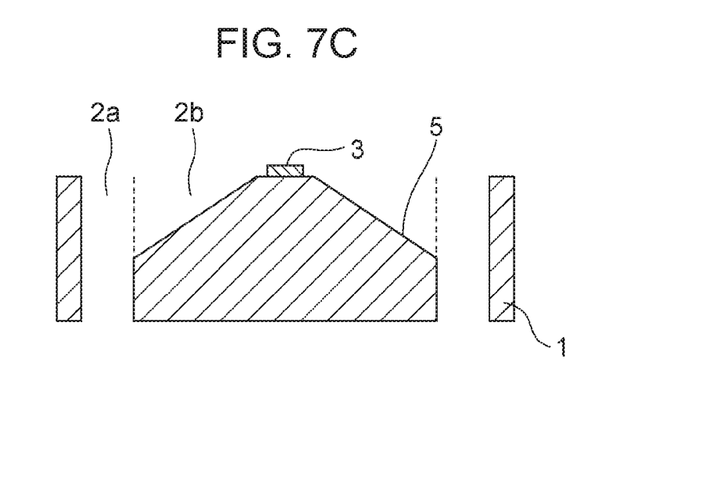

FIG. 7A illustrates another mask 10 in which the number of openings is increased on the basis of the mask 10 in FIG. 6B. The increased number of openings results in smooth steps (see FIG. 7C) after reactive ion etching is performed and the unetched portions 6 are removed as described with reference to FIGS. 6D to 6E. In the case in which the predetermined direction is set to a direction intersecting the arranging direction of the energy generating elements, it is preferable that the number of openings per one energy generating element be five or more on one side of the energy generating element for forming the smooth steps.

FIGS. 8A to 8D illustrate modification examples of the shape of opening of the mask. These masks are viewed from the same direction as that of the masks and the substrates described with reference to FIGS. 3A to 3F and FIGS. 6A to 6E.

Figure 8A:
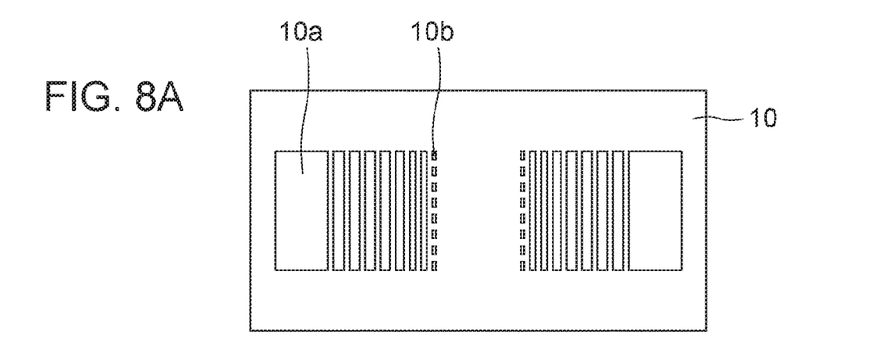
FIGS. 8A to 8D are views illustrating example shapes of openings of masks.

For example, as illustrated in FIG. 8A, another type of relatively small opening-width portion 10b may be provided, in which the opening width is small both in the arranging direction of the energy generating elements and in the direction intersecting the arranging direction. In this case, as illustrated in FIG. 8A, a plurality of the relatively small opening-width portions 10b of this type may be arranged parallel to the arranging direction of the energy generating elements.

Figure 8B:
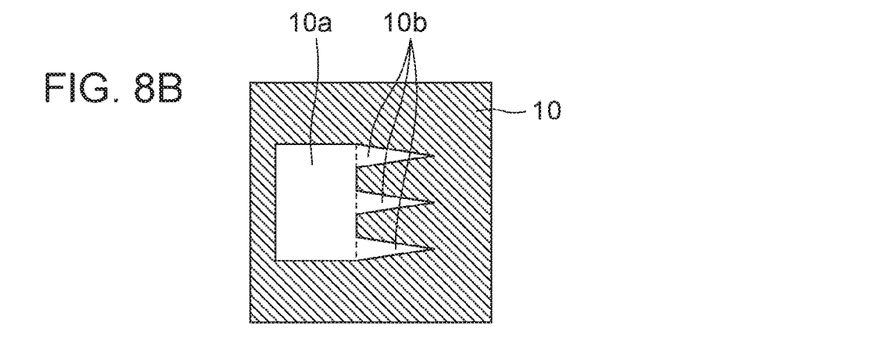
Figure 8C:
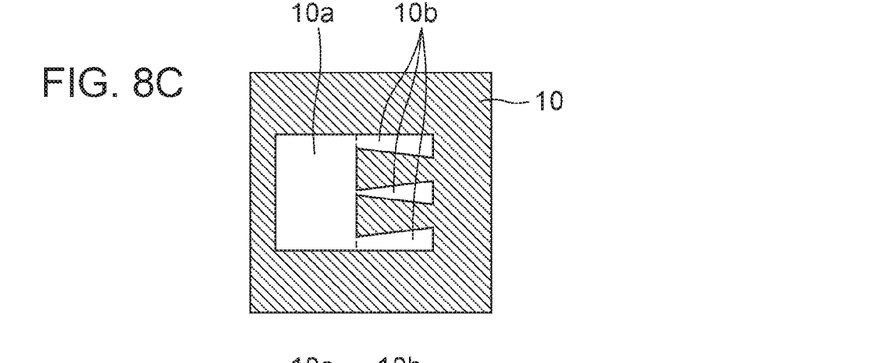
Figure 8D:
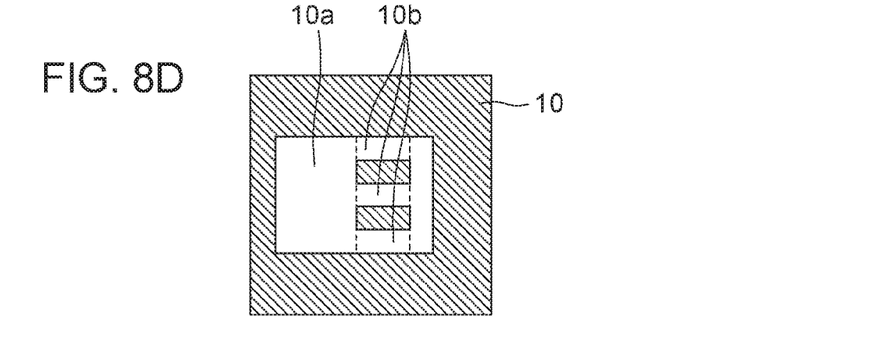

As an alternative, as illustrated in FIG. 8B, the relatively small opening-width portions 10b, in which the opening width is measured in the predetermined direction, may be formed into shapes that become narrower as the distance from the energy generating element becomes small (for example, triangular shapes). As another alternative, as illustrated in FIG. 8C, the relatively small opening-width portions 10b, in which the opening width is measured in the predetermined direction, may be formed into shapes that become wider as the distance from the energy generating element becomes small. Moreover, as illustrated in FIG. 8D, portions of the mask 10 may remain as islands between relatively small opening-width portions 10b.

Example

The disclosure will be described more specifically by using an example.

A substrate 1 illustrated in FIG. 3A was prepared first. The substrate 1 is a substrate that is made of single crystal silicon and has the energy generating element 3 on the first surface 1a. The energy generating element 3 is made of TaSiN.

Next, a positive photosensitive resin was applied on the first surface 1a of the substrate 1 and then exposed to light and developed. The mask 10 illustrated in FIGS. 3B and 3C was thereby formed from the positive photosensitive resin. The mask 10 was provided with an opening that included a relatively large opening-width portion 10a and a relatively small opening-width portion 10b, in which the opening width was measured in the predetermined direction (direction C1). Note that the predetermined direction (direction C1) is parallel to the arranging direction of energy generating elements 3. Width C was set to 5.0 micrometers, width D was set to 20.0 micrometers, and width E was set to 18.5 micrometers. All of the portions 10b (total six portions in FIG. 3B) had the same width C. All of the portions 10b and 10a also had the same width D and the same width E.

Subsequently, reactive ion etching was performed on the substrate 1 through the openings of the mask 10. Thus, the liquid discharge head substrate as illustrated in FIGS. 3D to 3F was manufactured. In the liquid discharge head manufactured, as illustrated in FIG. 3E, the ink supply port had the through portion 2a and the non-through portion 2b, and the substrate 1 had a depth F of 206.8 micrometers and a depth G (i.e., the thickness of the substrate 1) of 255.8 micrometers.

While the disclosure has been described with reference to example embodiments, it is to be understood that the invention is not limited to the disclosed example embodiments. The scope of the following claims is to be accorded the broadest interpretation so as to encompass all such modifications and equivalent structures and functions.

This application claims the benefit of Japanese Patent Application No. 2017-229294 filed on Nov. 29, 2017, which is hereby incorporated by reference herein in its entirety.

What is claimed is:

1. A method of manufacturing an inkjet head substrate that includes
    a plurality of energy generating elements that generate energy for discharging ink; and
    an ink supply port having
        a through portion that passes through the inkjet head substrate from a first surface thereof on which the energy generating elements is disposed to a second surface thereof that is opposite to the first surface; and
        a non-through portion that does not pass through from the first surface to the second surface,
        the non-through portion being disposed at a position closer than the through portion to the energy generating elements in a side of the first surface,
    the method comprising:
    providing a substrate;
    disposing a mask on the first surface of the substrate, the mask including an opening that has a relatively large opening-width portion and a relatively small opening-width portion, in which the opening width is measured in a predetermined direction; and
    forming the through portion in the substrate at a position corresponding to the relatively large opening-width portion and the non-through portion in the substrate at a position corresponding to the relatively small opening-width portion by performing reactive ion etching on the substrate through the opening of the mask in a single operation.

2. The method of manufacturing the inkjet head substrate according to claim 1, wherein
    the predetermined direction is parallel to an arranging direction of the energy generating elements.

3. The method of manufacturing the inkjet head substrate according to claim 1, wherein the predetermined direction intersects an arranging direction of the energy generating elements.

4. The method of manufacturing the inkjet head substrate according to claim 1, wherein
    the mask includes a single one of the opening, and
    the opening of the mask includes relatively large opening-width portion and a relatively small opening-width portion, in which the opening width is measured in the predetermined direction.

5. The method of manufacturing the inkjet head substrate according to claim 1, wherein
    the mask includes a plurality of the openings, and
    the relatively large opening-width portions and the relatively small opening-width portions are allocated to the plurality of the openings of the mask, in which the opening width is measured in the predetermined direction.

6. The method of manufacturing the inkjet head substrate according to claim 1, wherein
  a plurality of the non-through portions are provided,
  the forming the through portion and the non-through portion includes removing a portion of the substrate located between the non-through portions, and
  the removing the portion of the substrate is performed after performing the reactive ion etching.

7. The method of manufacturing the inkjet head substrate according to claim 6, wherein the removing the portion of the substrate is performed by etching.

8. The method of manufacturing the inkjet head substrate according to claim 1, wherein an inclined surface is formed on the substrate under the non-through portion.

9. The method of manufacturing the inkjet head substrate according to claim 1, wherein a stepwise surface is formed on the substrate under the non-through portion.

10. The method of manufacturing the inkjet head substrate according to claim 1, wherein the substrate is made of silicon.

* * * * *